United States Patent [19]

Lu

[11] Patent Number: 5,789,316
[45] Date of Patent: Aug. 4, 1998

[54] SELF-ALIGNED METHOD FOR FORMING A NARROW VIA

[75] Inventor: Chih-Yuan Lu, Hsinchu, Taiwan

[73] Assignee: Vanguard International Semiconductor Corporation, Hsin-Chu, Taiwan

[21] Appl. No.: 813,310

[22] Filed: Mar. 10, 1997

[51] Int. Cl.⁶ ................................. H01L 21/4763
[52] U.S. Cl. ............................. 438/637; 438/639
[58] Field of Search ............................. 438/637–640

[56] References Cited

U.S. PATENT DOCUMENTS

| | | | |
|---|---|---|---|
| 4,535,532 | 8/1985 | Lancaster | 438/621 |
| 4,641,420 | 2/1987 | Lee | 29/511 |
| 4,997,790 | 3/1991 | Woo et al. | 437/195 |
| 5,444,021 | 8/1995 | Chung et al. | 437/195 |
| 5,604,155 | 2/1997 | Wang | 438/629 |
| 5,654,238 | 8/1997 | Cronnin et al. | 438/637 |
| 5,656,545 | 8/1997 | Yu | 438/629 |
| 5,661,083 | 8/1997 | Chen et al. | 438/637 |
| 5,712,207 | 1/1998 | Lee et al. | 438/629 |

*Primary Examiner*—John Niebling
*Assistant Examiner*—Michael S. Lebentritt
*Attorney, Agent, or Firm*—George O. Saile; Stephen B. Ackerman; Alek P. Szecsy

[57] ABSTRACT

A method for forming a narrow via through a portion of an integrated circuit layer between a pair of integrated circuit structures within an integrated circuit. There is first provided a substrate layer having a pair of integrated circuit structures formed thereupon. The integrated circuit structures are separated by a width over the substrate layer no less than the width of a narrow via desired to be formed through a portion of a first integrated circuit layer formed between the pair of integrated circuit structures plus two times a registration tolerance of a photoexposure apparatus employed in defining the location of a wide via from which is formed the narrow via plus two times a minimum integrated circuit layer width separating the narrow via from each integrated circuit structure within the pair of integrated circuit structures. There is then formed over the substrate layer and upon the integrated circuit structures the first integrated circuit layer. There is then formed through the portion of the first integrated circuit layer between the integrated circuit structures a wide via of width equal to the width of the narrow via plus two times the minimum integrated circuit layer width separating the narrow via from each integrated circuit structure. There is then formed conformally into the wide via a conformal second integrated circuit layer of thickness substantially equal to the minimum integrated circuit layer width separating the narrow via from each integrated circuit structure. There is then anisotropically etched the conformal second integrated circuit layer to remove completely a central portion of the conformal second integrated circuit layer at the bottom of the wide via while not substantially etching the portions of the conformal second integrated circuit layer formed upon the sidewalls of the wide via.

18 Claims, 3 Drawing Sheets

SELF-ALIGNED METHOD FOR FORMING A NARROW VIA

BACKGROUND OF THE INVENTION

1. Field of the Invention

The present invention relates generally to methods for forming vias through integrated circuit layers within integrated circuits. More particularly, the present invention relates to methods for forming narrow vias through portions of integrated circuit layers between horizontally spaced integrated circuit structures within integrated circuits.

2. Description of the Related Art

Integrated circuits are formed from semiconductor substrates within and upon whose surfaces are formed resistors, transistors, diodes and other electrical circuit elements. The electrical circuit elements are connected internally and externally to the semiconductor substrate upon which they are formed through patterned conductor layers which are separated by dielectric layers.

As integrated circuit device density has increased and integrated circuit device dimensions have decreased, it has become increasingly important within advanced integrated circuits to form vias, such as but not limited to contact vias and interconnection vias, of correspondingly smaller dimensions to access within advanced integrated circuits contacts, such as but not limited to semiconductor substrate contacts and patterned conductor layer contacts, of similarly decreased dimensions. While the trend towards continued narrowing of contact vias and interconnection vias will unlikely abate within advanced generations of integrated circuits, there nonetheless continues to occur problems properly fabricating vias, such as but not limited to contact vias and interconnection vias, through integrated circuit layers, such as but not limited to dielectric layers, within integrated circuits. In particular, where a via, such as but not limited to a contact via or an interconnection via, is desired to be formed through a portion of an integrated circuit layer, such as but not limited to a dielectric layer, which is formed between narrowly horizontally spaced integrated circuit structures within an integrated circuit, it is often difficult to form the via through the integrated circuit layer while leaving sufficient remaining thicknesses of the integrated circuit layer between the narrowly horizontally spaced integrated circuit structures and the via. Such a problem occurs, by means of example and without limitation, when there is desired to form within an integrated circuit a contact via through a dielectric layer to a source/drain region which is shared by a pair of field effect transistors (FETs) upon which is formed the dielectric layer. A schematic cross-sectional diagram of such an integrated circuit is shown in FIG. 1.

Figure 1:
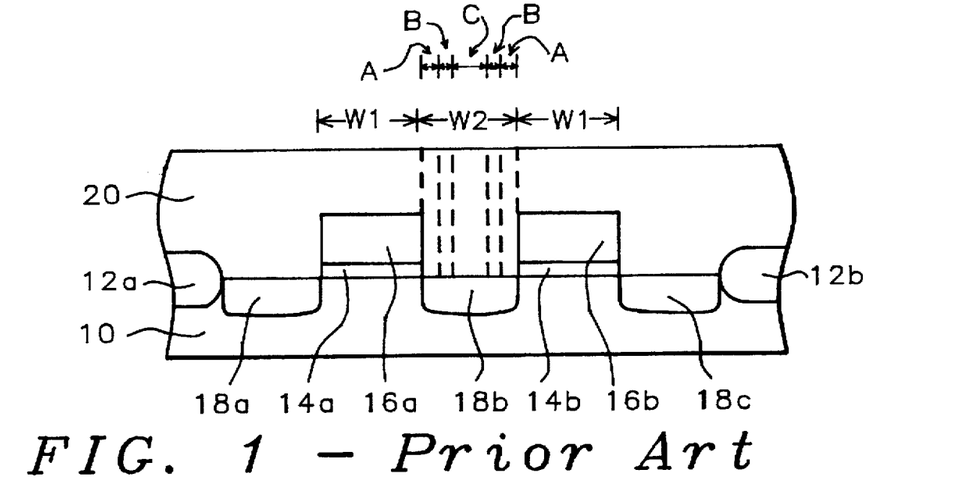
FIG. 1 shows a schematic cross-sectional diagram defining the dimensions of reference structures employed when forming a narrow contact via through a planarized pre-metal dielectric (PMD) layer accessing a shared source/drain region formed within an adjoining pair of field effect transistors (FETs) within an integrated circuit through a method conventional in the art of integrated circuit fabrication.

Shown in FIG. 1 is a semiconductor substrate 10 having formed therein and thereupon a pair of isolation regions 12a and 12b which define an active region of the semiconductor substrate 10. Upon the active region of the semiconductor substrate 10 is formed a pair of gate dielectric layers 14a and 14b which in turn have formed and aligned thereupon a pair of gate electrodes 16a and 16b. As is illustrated in FIG. 1, each of the gate electrodes 16a and 16b, and the gate dielectric layers 14a and 14b, has a width W1 upon the active region of the semiconductor substrate 10. Similarly, the gate electrodes 16a and 16b, and the gate dielectric layers 14a and 14b, are also separated by a width W2 upon the active region of the semiconductor substrate 10, where the width W2 is also aligned with the width within the semiconductor substrate 10 of a source/drain region 18b. Formed within the semiconductor substrate 10 at locations

2 other than those covered by the pair of gate dielectric layers 14a and 14b and the pair of gate electrodes 16a and 16b is a series of source/drain regions 18a, 18b and 18c, thus forming within and upon the semiconductor substrate 10 a pair of field effect transistors (FETs) which share the source/drain region 18b. Finally, there is shown in FIG. 1 formed over the semiconductor substrate 10 including the pair of field effect transistors (FETs) a planarized pre-metal dielectric (PMD) layer 20.

As is common in advanced integrated circuit fabrications which employ an integrated circuit structure analogous or equivalent to the integrated circuit structure whose schematic cross-sectional diagram is illustrated in FIG. 1, it is typically desirable to form through the planarized pre-metal dielectric (PMD) layer 20 a narrow contact via reaching the source/drain region 18b while maintaining the separation width W2 of the gate electrodes 16a and 16b at a minimum, thus providing optimal field effect transistor (FET) density. In order to achieve this goal, it is thus conventionally required that the separation distance W2 at least equal: (1) the width C of the narrow contact via desired to be formed through the planarized pre-metal dielectric layer 20; plus (2) two times a registration tolerance B of a photoexposure apparatus employed in defining the location of the narrow contact via with respect to the gate electrodes 16a and 16b; plus (3) two times a minimum thickness A of a resulting pair of patterned planarized pre-metal dielectric (PMD) dielectric layers formed from the planarized pre-metal dielectric (PMD) layer 20 adjoining each of the gate electrode 16a and 16b edges, where A, B and C are also illustrated in FIG. 1. Under circumstances where the separation width W2 of the gate electrodes 16a and 16b is greater than the sum of 2A+2B+C, it is then theoretically possible to directly etch the narrow contact via of width C through the planarized pre-metal dielectric (PMD) layer 20 while providing a pair of patterned planarized pre-metal dielectric (PMD) layers which adequately isolate each of the gate electrodes 16a and 16b from a contact layer subsequently formed into the narrow contact via.

As the width C of the narrow contact via desired to be formed through the planarized pre-metal dielectric (PMD) layer 20 becomes exceedingly small (ie: typically narrower than about 0.5 microns), the registration tolerance B of the photoexposure tooling employed in defining the location of the narrow contact via through the planarized pre-metal dielectric (PMD) layer 20 with respect to the gate electrodes 16a and 16b typically becomes proportionately larger with respect to the width C of the narrow contact via desired to be formed through the planarized pre-metal dielectric (PMD) layer 20. In addition, as the width C of the narrow contact via desired to be formed through the planarized pre-metal dielectric (PMD) layer 20 becomes exceeding small, the depth of focus (DoF) of the photoexposure apparatus employed in defining a patterned photoresist layer (not shown) which is in turn employed in defining the location of the narrow contact via with respect to the gate electrodes 16a and 16b also becomes reduced, thus ultimately compromising the resolution of the narrow contact via and precluding formation of the narrow contact via. For the foregoing reasons, it is thus often difficult within advanced integrated circuit fabrication to reproducibly form narrow vias through portions of integrated circuit layers formed between narrowly horizontally spaced integrated circuit structures, such as the narrow contact via of width C through the portion of the planarized pre-metal dielectric (PMD) layer 20 between the gate electrodes 16a and 16b as illustrated in FIG. 1, with accurate registration and adequate resolution when those narrow contact vias are desired to be formed with exceedingly narrow cross-section (ie: less than about 0.5 microns). It is thus towards forming within advanced integrated circuits narrow vias through integrated circuit layers with improved registration and improved resolution that the present invention is generally directed.

Novel methods for forming contact vias and contact structures within contact vias within integrated circuits have been disclosed within the art of integrated circuit fabrication. For example, Lee, in U.S. Pat. No. 4,641,420 discloses a metallization process which provides a contact structure with improved coverage within a contact via within an integrated circuit. Through the method there is formed upon the sidewalls within the contact via a smoothing layer prior to forming a conductor contact layer within the contact via. In addition, Woo et al., in U.S. Pat. No. 4,997,790 disclose a method through which there is formed a self-aligned contact via within a planarized integrated circuit. The method employs a sacrificial plug between an upper dielectric layer and a lower dielectric layer within the integrated circuit, where the sacrificial plug is first employed as an etch back or polish stop layer when planarizing the upper dielectric layer. After then removing the sacrificial plug the lower dielectric layer is anisotropically etched to form the self-aligned contact via within the planarized integrated circuit.

Desirable in the art are additional methods through which narrow vias, such as but not limited to narrow contact vias and narrow interconnection vias, may be formed through integrated circuit layers, such as but not limited to dielectric layers, within integrated circuits. Particularly desirable in the art are additional methods through which narrow vias, such as but not limited to narrow contact vias and narrow interconnection vias, may be formed with improved registration and improved resolution through portions of integrated circuit layers which are formed between horizontally spaced integrated circuit structures within integrated circuits, while maintaining minimal horizontal spacing of those integrated circuit structures. It is towards the foregoing goals that the present invention is more specifically directed.

SUMMARY OF THE INVENTION

A first object of the present invention is to provide a method for forming a via, such as but not limited to a contact via or an interconnection via, through an integrated circuit layer within an integrated circuit.

A second object of the present invention is to provide a method in accord with the first object of the present invention, where the via is formed with improved registration and improved resolution through a portion of the integrated circuit layer between a pair of horizontally spaced integrated circuit structures within the integrated circuit.

A third object of the present invention is to provide a method in accord with the first object of the present invention and the second object of the present invention, which method is readily manufacturable.

In accord with the objects of the present invention, there is provided by the present invention a method for forming a via through an integrated circuit layer within an integrated circuit. To practice the method of the present invention, there is first formed over a substrate layer a pair of integrated circuit structures, where the pair of integrated circuit structures is separated by a separation width over the substrate layer. The separation width over the substrate layer is no less than: (1) the width of a narrow via desired to be formed through a portion of a first integrated circuit layer formed between the pair of integrated circuit structures; plus (2) two times a registration tolerance of a photoexposure apparatus employed in defining the location of a wide via from which is formed the narrow via; plus (3) two times a minimum integrated circuit layer width separating the narrow via from each integrated circuit structure within the pair of integrated circuit structures. There is then formed upon the substrate layer and upon the integrated circuit structures the first integrated circuit layer. There is then formed through the portion of the first integrated circuit layer between the integrated circuit structures a wide via of width equal to the width of the narrow via plus two times the minimum integrated circuit layer width separating the narrow via from each integrated circuit structure within the pair of integrated circuit structures. There is then formed conformally into the wide via a conformal second integrated circuit layer of thickness substantially equal to the minimum integrated circuit layer width separating the narrow via from each integrated circuit structure within the pair of integrated circuit structures. Finally, there is then anisotropically etched the conformal second integrated circuit layer to remove completely a central portion of the conformal second integrated circuit layer from the bottom of the wide via while not substantially etching the portions of the conformal second integrated circuit layer formed upon the sidewalls of the wide via.

The present invention provides a method for forming a via, such as but not limited to a contact via or an interconnection via, through an integrated circuit layer within an integrated circuit, where the via is formed with improved registration and improved resolution through a portion of the integrated circuit layer between a pair of horizontally spaced integrated circuit structures within the integrated circuit. The method of the present invention achieves this goal by: (1) first forming a wide via through a portion of a first integrated circuit layer formed between the pair of integrated circuit structures within the integrated circuit, where the width of the wide via is equal to the width of a narrow via desired to be formed through the first integrated circuit layer plus two times a minimum integrated circuit layer width separating the narrow via from each integrated circuit structure within the pair of integrated circuit structures; then (2) forming into the wide via a conformal second integrated circuit layer of thickness substantially equal to the thickness of the minimum integrated circuit layer width separating the narrow via from each integrated circuit structure within the pair of integrated circuit structures; and finally (3) anisotropically etching the conformal second integrated circuit layer to remove the central portion of the conformal second integrated circuit layer from the bottom of the wide via while not substantially etching the portions of the conformal second integrated circuit layer upon the sidewalls of the wide via. Within the method of the present invention the pair of integrated circuit structures is horizontally separated by a width no less than: (1) the width of the narrow via desired to be formed through the first integrated circuit layer; plus (2) two times the registration tolerance of the photoexposure apparatus employed in defining the location of the wide via from which is formed the narrow via; plus (3) two times the minimum integrated circuit layer width separating the narrow via from each integrated circuit structure within the pair of integrated circuit structures.

Thus, through the method of the present invention, there is employed in forming a narrow via through a portion of an integrated circuit layer between a pair of integrated circuit structures a photoexposure apparatus which defines a wide via through the portion of the integrated circuit layer. Since there is employed through the method of the present invention a photoexposure method which initially defines a wide via rather than a narrow via, and the narrow via is subsequently formed from the wide via through a self-aligned non-photolithographic method, there is ultimately formed through the method of the present invention a narrow via with improved registration and improved resolution.

The method of the present invention is readily manufacturable. The method of the present invention provides that: (1) a wide via is first formed through a portion of a first integrated circuit layer between a pair of horizontally spaced integrated circuit structures within an integrated circuit; (2) a conformal second integrated circuit layer is then formed into the wide via; and (3) the central portion of the conformal second integrated circuit layer at the bottom of the wide via is then removed through anisotropic etching while not substantially etching the portions of the conformal second integrated circuit layer formed upon the wide via sidewalls. Since methods and materials through which may be practiced each of the foregoing three integrated circuit fabrication processes are generally known in the art of integrated circuit fabrication, the method of the present invention is thus readily manufacturable.

BRIEF DESCRIPTION OF THE DRAWINGS

The objects, features and advantages of the present invention are understood within the context of the Description of the Preferred Embodiments, as set forth below. The Description of the Preferred Embodiments is understood within the context of the accompanying drawings, which form a material part of this disclosure, wherein.

DESCRIPTION OF THE PREFERRED EMBODIMENTS

The present invention provides a method for forming within an integrated circuit a via, such as but not limited to a contact via or an interconnection via, through a portion of an integrated circuit layer, such as but not limited to a dielectric layer, between a pair of horizontally spaced integrated circuit structures, where the via is formed with improved registration and improved resolution. The method of the present invention achieves these goals through forming through a portion of a first integrated circuit layer between a pair of integrated circuit structures formed upon a substrate layer within an integrated circuit a wide via, where the wide via has a width equal to the width of a narrow via desired to be formed through the first integrated circuit layer plus two times a minimum integrated circuit layer width separating the narrow via from each integrated circuit structure within the pair of integrated circuit structures. There is then formed into the wide via a conformal second integrated circuit layer of thickness substantially equal to the minimum integrated circuit layer width separating the narrow via from each integrated circuit structure within the pair of integrated circuit structures. Finally, there is then etched anisotropically a central portion of the conformal second integrated circuit layer from the bottom of the wide via while not substantially etching the portions of the conformal second integrated circuit layer from the sidewalls of the wide via. Within the method of the present invention, the pair of integrated circuit structures is separated by no less than: (1) the width of the narrow via desired to be formed through the portion of the first integrated circuit layer between the integrated circuit structures; plus (2) two times a registration tolerance of the photoexposure apparatus employed in defining the location of the wide via with respect to the integrated circuit structures; plus (3) two times the minimum integrated circuit layer width separating the narrow via from each integrated circuit structure within the pair of integrated circuit structures.

The method of the present invention may be employed in forming vias through portions of integrated circuit layers between integrated circuit structures within integrated circuits including but not limited to dynamic random access memory (DRAM) integrated circuits, static random access memory (SRAM) integrated circuits, logic integrated circuits, application specific integrated circuits (ASICs), integrated circuits having within their fabrications field effect transistors (FETs), integrated circuits having within their fabrications bipolar transistors and integrated circuits having within their fabrications bipolar complementary metal oxide semiconductor (BiCMOS) transistors.

FIRST PREFERRED EMBODIMENT

The first preferred embodiment of the method of the present invention provides a general embodiment of the method of the present invention which illustrates the method of the present invention employed in forming a narrow via through a portion of a first integrated circuit layer between a pair of horizontally spaced integrated circuit structures, where the narrow via accesses a substrate layer upon which is formed the pair of integrated circuit structures and the first integrated circuit layer.

Within the first preferred embodiment of the method of the present invention, the substrate layer may be selected from the group of substrate layers including but not limited to conductor substrate layers, semiconductor substrate layers and dielectric substrate layers. Similarly, within the first preferred embodiment of the method of the present invention, the integrated circuit structures may be selected from the group of integrated circuit structures including but limited to integrated circuit conductor structures, integrated circuit semiconductor structures and integrated circuit dielectric structures. Finally, within the first preferred embodiment of the method of the present invention, the first integrated circuit layer may be selected from the group of integrated circuit layers including but not limited to integrated circuit conductor layers, integrated circuit semiconductor layers and integrated circuit dielectric layers. Within the first preferred embodiment of the method of the present invention, there may be employed several combinations of substrate layers, integrated circuit structures and first integrated circuit layers, although combinations including integrated circuit conductor structures and first integrated circuit dielectric layers are most likely to be prevalent within the method of the present invention.

Figure 2:
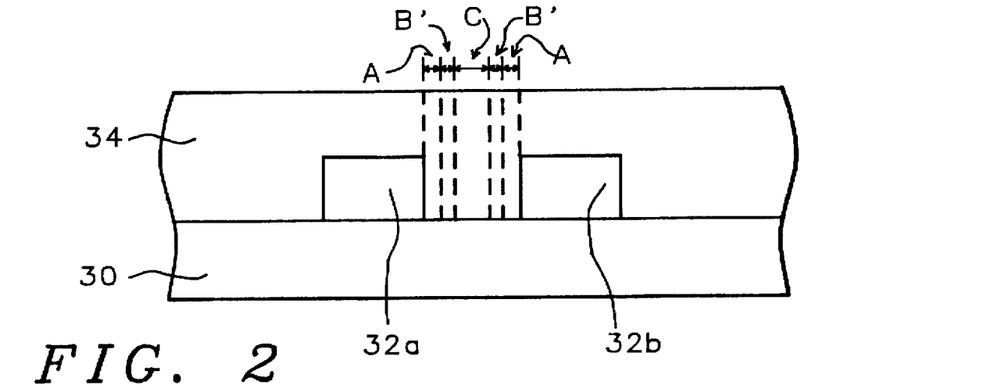
FIG. 2 to FIG. 4 show a series of schematic cross-sectional diagrams illustrating the results of progressive stages in forming a via, such as a contact via or an interconnection via, through an integrated circuit layer to access a substrate layer through a first preferred embodiment of the method of the present invention.
Figure 3:
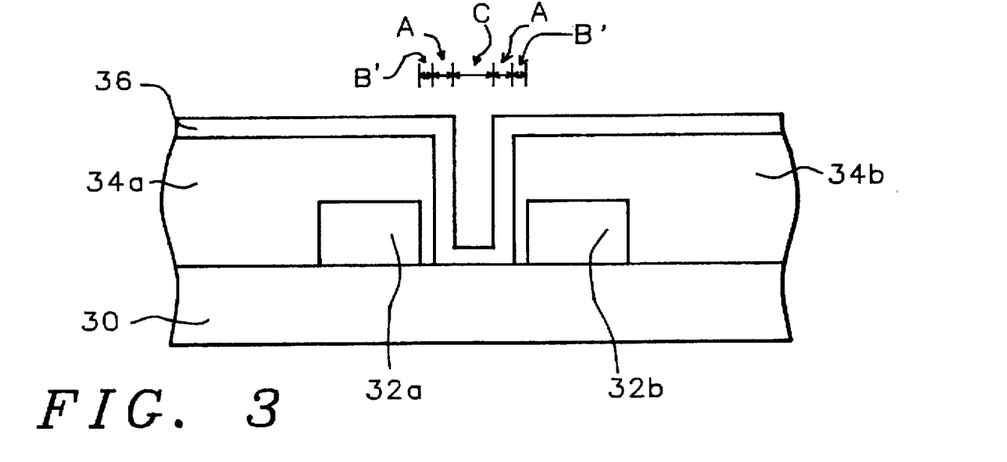
Figure 4:
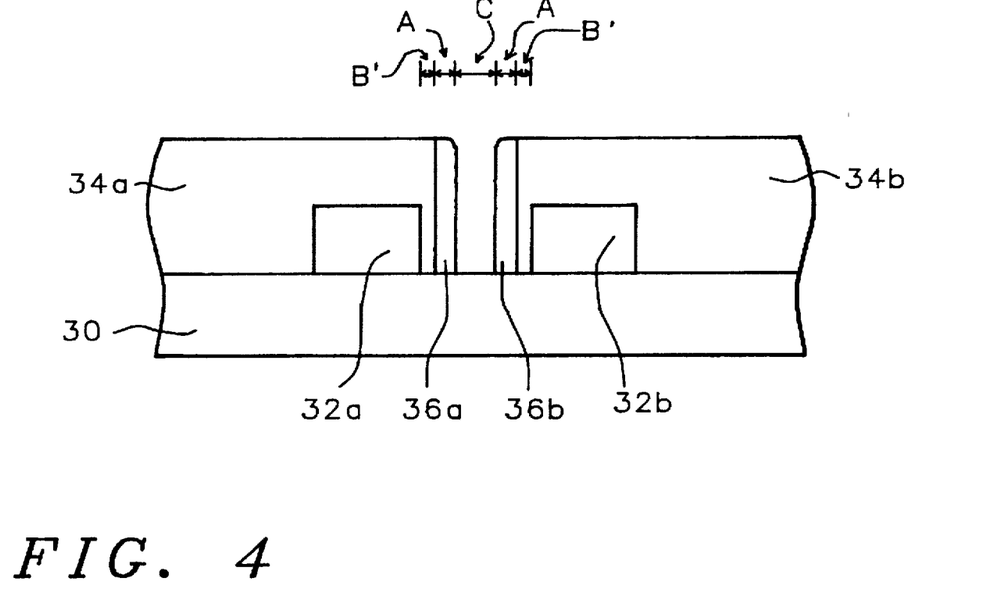

Referring now to FIG. 2 to FIG. 4 there is shown a series of schematic cross-sectional diagrams illustrating the results of progressive stages in forming through the first preferred embodiment of the method of the present invention the narrow via through the first integrated circuit layer to access the substrate layer within the integrated circuit. Shown in FIG. 2 is a schematic cross-sectional diagram of the integrated circuit at an early stage in its fabrication.

Shown in FIG. 2 is a substrate layer 30 having formed thereupon a pair of integrated structures 32a and 32b, which in turn has formed thereupon a planarized first integrated circuit layer 34. Although the method of the present invention may be employed where the first integrated circuit layer is a conformal integrated circuit layer rather than a planarized integrated circuit layer, the first preferred embodiment of the method of the present invention preferably employs a planarized first integrated circuit layer. Within the first preferred embodiment of the method of the present invention, each of the integrated circuit structures 32a and 32b preferably has a thickness upon the substrate layer 30 of from about 500 to about 10000 angstroms, while the planarized first integrated circuit layer 34 preferably has a thickness upon the substrate layer 30 and each of the integrated circuit structures 32a and 32b of from about 500 to about 10000 angstroms. More preferably, the planarized first integrated circuit layer 34 has a thickness over each integrated circuit structure 32a or 32b at least equal to a minimum integrated circuit layer width separating a narrow via desired to be formed through the planarized first integrated circuit layer 34 from each integrated circuit structure 32a or 32b within the pair of integrated circuit structures 32a and 32b. Within the first preferred embodiment of the method of the present invention, the pair of integrated circuit structures 32a and 32b is separated by a distance no less than: (1) the width C of a narrow via desired to be formed through the portion of the planarized first integrated circuit layer 34 between by the pair of integrated circuit structures 32a and 32b; plus (2) two times a registration tolerance B' of a photoexposure apparatus employed in defining the location of a wide via from which is formed the narrow via; plus (3) two times a minimum integrated circuit layer width A separating the narrow via from each integrated circuit structure 32a or 32b within the pair of integrated circuit structures 32a and 32b, where A, B', and C are defined as shown in FIG. 2.

Within the first preferred embodiment of the method of the present invention: (1) the narrow via preferably has a width C of from about 0.05 to about 0.5 microns; (2) the registration tolerance B' of the photoexposure apparatus employed in defining the location of the wide via with respect to the integrated circuit structures 32a and 32b is typically from about 0.02 to about 0.2 microns; and (3) the minimum integrated circuit layer width A separating the narrow via of width C from each integrated circuit structure 32a or 32b within the pair of integrated circuit structures 32a and 32b is typically from about 0.025 to about 0.25 microns.

Referring now to FIG. 3, there is shown a schematic cross-sectional diagram illustrating the results of further processing of the integrated circuit whose schematic cross-sectional diagram is illustrated in FIG. 2. Shown in FIG. 3 is the results of forming through the portion of the planarized first integrated circuit layer 34 between the pair of integrated circuit structures 32a and 32b a wide via of width equal to the width C of the narrow via desired to be formed through the portion of the integrated circuit layer 34 between the pair of integrated circuit structures 32a and 32b plus two times the minimum integrated circuit layer width A separating the narrow via from each integrated circuit structure 32a or 32b within the pair of integrated circuit structures 32a and 32b, thus simultaneously forming the pair of patterned planarized first integrated circuit layers 34a and 34b. In addition, there is also shown in FIG. 3 the presence of a second conformal integrated circuit layer 36 formed upon the patterned planarized first integrated circuit layers 34a and 34b, and into the wide via. Within the first preferred embodiment of the method of the present invention, the conformal second integrated circuit layer 36 is preferably formed of a material having a substantially equivalent electrical conductivity as the planarized first integrated circuit layer 34. Similarly, within the first preferred embodiment of the method of the present invention, the conformal second integrated circuit layer 36 is formed to a thickness substantially equal to the minimum integrated circuit layer width A separating the narrow via from each integrated circuit structure 32a or 32b within the pair of integrated circuit structures 32a and 32b.

By employing within the first preferred embodiment of the method of the present invention the width C+2A for the wide via, there is formed within the first preferred embodiment of the method of the present invention a wide via which is registered completely between the integrated circuit structures 32a and 32b even under circumstances of worst possible mis-registration (ie: the wide via directly adjoins either the integrated circuit structure 32a or 32b and exposes a sidewall of either the integrated structure 32a or the integrated circuit structure 32b) within the photoexposure apparatus employed in defining the location of the wide via with respect to the integrated circuit structures 32a and 32b. Similarly, by employing within the first preferred embodiment of the method of the present invention the conformal second integrated circuit layer 36 of thickness substantially equal to the minimum integrated circuit layer width A separating the narrow via from each integrated circuit structure 32a or 32b within the pair of integrated circuit structures 32a and 32b, there is formed through the first preferred embodiment of the method of the present invention an adequate thickness of the conformal second integrated circuit layer 36 to separate the subsequently formed narrow via from each integrated circuit structure 32a or 32b within the pair of integrated circuit structures 32a and 32b, even under circumstances of worst possible mis-registration of the photoexposure apparatus employed in defining the location of the wide via with respect to the integrated circuit structures 32a and 32b.

Referring now to FIG. 4, there is shown a schematic cross-sectional diagram illustrating the results of further processing of the integrated circuit whose schematic cross-sectional diagram is illustrated in FIG. 3. Shown in FIG. 4 is the results of anisotropically etching the conformal second integrated circuit layer 36 to remove the central portion of the conformal second integrated circuit layer 36 at the bottom of the wide via while not substantially etching the portions of the conformal second insulator layer 36 formed upon the wide via sidewalls, thus forming upon the sidewalls of the wide via a pair of second integrated circuit spacer layers 36a and 36b which define the narrow via of width C. The anisotropic etching method employed in forming from the conformal second integrated circuit layer 36 the pair of second integrated circuit spacer layers 36a and 36b will typically be a reactive ion etch (RIE) anisotropic etching method employing a reactant gas composition appropriate to the material from which is formed conformal second integrated circuit layer 36.

Upon completion of the anisotropic etching in forming the second integrated circuit spacer layers 36a and 36b, there is formed the narrow via of width C through the portion of the planarized first integrated circuit layer 34 between the pair of integrated circuit structures 32a and 32b. The narrow via of width C so formed is formed with improved registration and with improved resolution since the photoexposure apparatus employed in ultimately forming the narrow via of width C first forms the wide via of width C+2A, which wide via is then subsequently subjected to further non-photolithographic processing in forming the narrow via. Under such circumstances, the narrow via of width C may be formed of a width not otherwise resolvable by the photoexposure apparatus employed in forming the wide via of width C+2A, thus simultaneously allowing a narrow separation width of the pair of integrated circuit structures 32a and 32b not otherwise achievable within the integrated circuit within which is formed the integrated circuit structures 32a and 32b.

As is similarly understood by a person skilled in the art, the via size reduction aspects of the first preferred embodiment of the method of the present invention may also be employed in general when it is desired to form through an integrated circuit layer within an integrated circuit a narrow via of width not otherwise resolvable by an available photoexposure apparatus. The narrow via, or the wide via from which is formed the narrow via, need not necessarily be bounded by integrated circuit structures such as the integrated circuit structures 32a and 32b as illustrated in FIG. 2 to FIG. 4.

SECOND EMBODIMENT

In addition to the first preferred embodiment of the method of the present invention which provides a general embodiment of the method of the present invention, there also exists a second preferred embodiment of the method of the present invention which provides a more specific embodiment of the method of the present invention. The more specific embodiment of the method of the present invention is employed in forming through a portion of a planarized pre-metal dielectric (PMD) layer between a pair of gate electrodes within an adjoining pair of field effect transistors (FETs) within an integrated circuit a contact via accessing a source/drain region shared by the pair of field effect transistors (FETs). A series of schematic cross-sectional diagrams illustrating the results of progressive stages in forming the contact via within the integrated circuit through the second preferred embodiment of the method of the present invention is shown by reference to FIG. 5 to FIG. 7. Shown in FIG. 5 is a schematic cross-sectional diagram of the integrated circuit at an early stage in its fabrication.

Figure 5:
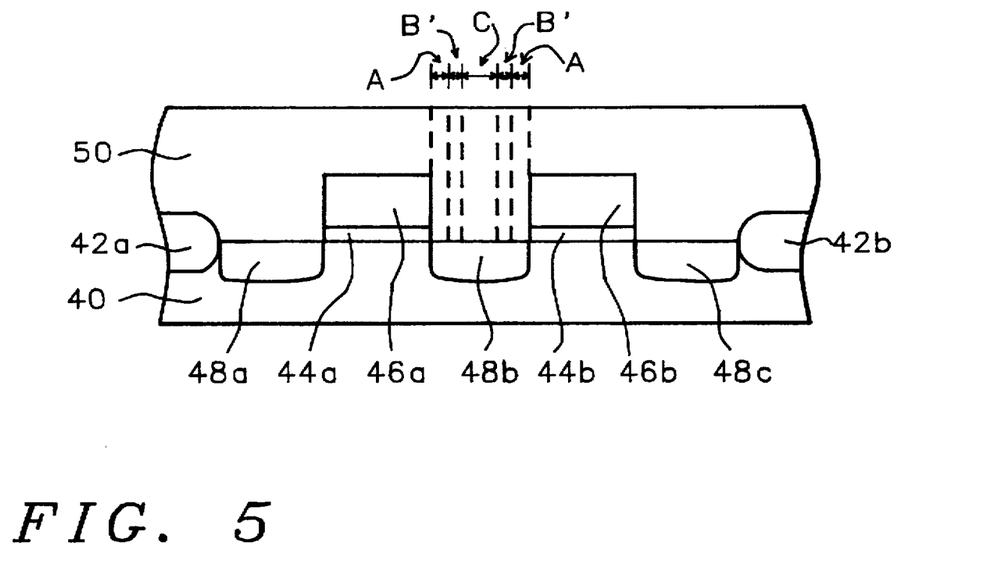
FIG. 5 to FIG. 7 show a series of schematic cross-sectional diagrams illustrating the results of progressive stages in forming a contact via through a planarized pre-metal dielectric (PMD) layer to access a source/drain region shared by an adjoining pair of field effect transistors (FETs) formed beneath the planarized pre-metal dielectric (PMD) layer through a second preferred embodiment of the method of the present invention.

Shown in FIG. 5 is a semiconductor substrate 40 having formed therein and thereupon a pair of isolation regions 42a and 42b which define an active region of the semiconductor substrate 40. Although semiconductor substrates are known in the art with either dopant polarity, various dopant concentrations and several crystallographic orientations, for the second preferred embodiment of the method of the present invention, the semiconductor substrate 40 is preferably a (100) silicon semiconductor substrate having a N- or a P- doping. Similarly, although it is also known in the art that isolation regions may be formed within and/or upon semiconductor substrates through methods including but not limited to isolation region thermal growth methods and isolation region deposition/patterning methods, for the second preferred embodiment of the method of the present invention, the pair of isolation regions 42a and 42b formed within and upon the semiconductor substrate 40 is preferably formed through an isolation region thermal growth method wherein portions of the semiconductor substrate 40 exposed through an appropriate thermal oxidation mask are oxidized at a temperature of from about 800 to about 1100 degrees centigrade to form isolation regions 42a and 42b of silicon oxide within and upon the semiconductor substrate 40.

Also shown within FIG. 5 formed within or upon the active region of the semiconductor substrate 40 is a series of structures which forms an adjoining pair of field effect transistors (FETs). The series of structures includes: (1) a pair of gate dielectric layers 44a and 44b formed upon the active region of the semiconductor substrate 40; (2) a pair of gate electrodes 46a and 46b formed and aligned upon the pair of gate dielectric layers 44a and 44b; and (3) a series of source/drain regions 48a, 48b and 48c formed within the active region of the semiconductor substrate 40 at areas not occupied by the pair of gate dielectric layers 44a and 44b and the pair of gate electrodes 46a and 46b. As is shown within FIG. 5, the source/drain region 48b is shared by the pair of field effect transistors (FETs) formed within and upon the semiconductor substrate 40.

Each of the foregoing structures employed in forming the pair of field effect transistors (FETs) formed within and upon the semiconductor substrate 40 may be formed through methods and materials as are conventional in the art of field effect transistor (FET) fabrication. Typically and preferably, each gate dielectric layer 44a or 44b within the pair of gate dielectric layers 44a and 44b is formed through patterning through methods as are conventional in the art of a blanket gate dielectric layer formed upon the active region of the semiconductor substrate 40 at a thickness of from about 35 to about 150 angstroms. Similarly, each gate electrode 46a or 46b within the pair of gate electrodes 46a and 46b is formed and aligned upon the corresponding gate dielectric layer 44a or 44b through patterning through methods as are conventional in the art of a blanket layer of gate electrode material formed upon the active region of the semiconductor substrate to a thickness of from about 500 to about 5000 angstroms. Preferably, although not exclusively, the blanket layer of gate electrode material is formed from a doped polysilicon material or a polycide material. Finally, the series of source/drain regions 48a, 48b and 48c is preferably formed within the active region of the semiconductor substrate 40 at areas not occupied by the gate dielectric layers 44a and 44b, and the gate electrodes 46a and 46b, through ion implanting a suitable dopant ion into the active region of the semiconductor substrate 40 at an ion implantation dose of from about 1E15 to about 2E 16 ions per square centimeter and an ion implantation energy of from about 10 to about 50 keV.

Finally, there is shown in FIG. 5 the presence of a planarized pre-metal dielectric (PMD) layer 50 formed over the semiconductor substrate 40 including the structures which form the pair of field effect transistors (FETs). Methods and materials through which planarized pre-metal dielectric (PMD) layers may be formed within integrated circuits are known within the art of integrated circuit fabrication. Planarized pre-metal dielectric layers may be formed within integrated circuits through planarizing, employing planarizing methods such as but not limited to reactive ion etch (RIE) etchback planarizing methods and chemical mechanical polish (CMP) planarizing methods as are conventional in the art, of conformal dielectric layers formed within integrated circuits. In turn, conformal dielectric layers may be formed within integrated circuits through methods including but not limited to chemical vapor deposition (CVD) methods, plasma enhanced chemical vapor deposition (PECVD) methods and physical vapor deposition (PVD) sputtering methods through which may be formed conformal dielectric layers of dielectric materials including but not limited to silicon oxide dielectric materials, silicon nitride dielectric materials and silicon oxynitride dielectric materials. For the second preferred embodiment of the method of the present invention, the planarized pre-metal dielectric (PMD) layer 50 is preferably formed through planarizing through a chemical mechanical polish (CMP) planarizing method as is conventional in the art of a conformal pre-metal dielectric (PMD) layer formed of a silicon oxide dielectric material deposited through a plasma enhanced chemical vapor deposition (PECVD) method, although other methods and materials may alternatively be employed in forming the planarized pre-metal dielectric (PMD) layer 50. Preferably, the planarized pre-metal dielectric (PMD) layer 50 so formed is formed to a thickness of from about 1000 to about 10000 angstroms.

For reasons similar to those discussed above with respect to the integrated circuit structures 32a and 32b within the integrated circuit whose schematic cross-sectional diagram is illustrated in FIG. 2, the gate electrodes 46a and 46b within the integrated circuit whose schematic cross-sectional diagram is illustrated in FIG. 5 are similarly separated upon the semiconductor substrate 40 by a separation width, where the separation width is no less than: (1) a width C of a narrow via desired to be formed through the portion of the planarized pre-metal dielectric (PMD) layer 50 between the gate electrodes 46a and 46b; plus (2) two times a registration tolerance B' of a photoexposure apparatus employed in defining the location of a wide via from which is formed the narrow via; plus (3) two times a minimum integrated circuit layer width A separating the narrow via from each gate electrode 46a or 46b within the pair of gate electrodes 46a and 46b, where A, B and C are defined within FIG. 5.

Similarly with the first preferred embodiment of the method of the present invention, within the second preferred embodiment of the method of the present invention: (1) the narrow via preferably has a width C of from about 0.05 to about 0.5 microns; (2) the registration tolerance B' of the photoexposure apparatus employed in defining the location of the wide via from which is formed the narrow via is typically from about 0.02 to about 0.2 microns; and (3) the minimum integrated circuit layer width A separating the narrow via of width C from each gate electrode 46a or 46b within the pair of gate electrodes 46a and 46b is typically from about 0.025 to about 0.25 microns.

Figure 6:
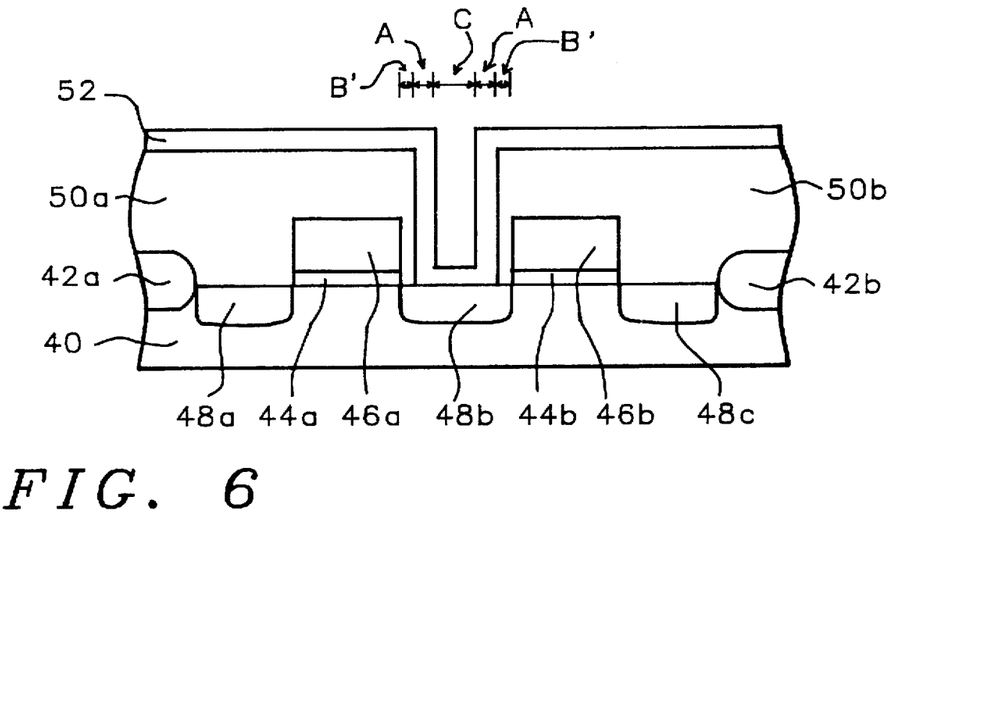

Referring now to FIG. 6, there is shown a schematic cross-sectional diagram illustrating the results of further processing of the integrated circuit whose schematic cross-sectional diagram is illustrated in FIG. 5. Shown in FIG. 6 is the results of: (1) forming through the portion of the planarized pre-metal dielectric (PMD) layer 50 between by the pair of gate electrodes 46a and 46b a wide via of width equal to the width C of the narrow via desired to be formed through the planarized pre-metal dielectric (PMD) layer 50 plus two times the minimum integrated circuit layer width A separating the narrow via from each gate electrode 46a or 46b within the pair of gate electrodes 46a and 46b, thus simultaneously forming a pair of patterned planarized pre-metal dielectric (PMD) layers 50a and 50b; and (2) forming then a conformal second dielectric layer 52 upon the patterned planarized pre-metal dielectric (PMD) layers 50a and 50b and into the wide via, where the conformal second dielectric layer 52 has a thickness substantially equal to the minimum integrated circuit layer width A separating the narrow via from each gate electrode 46a or 46b within the pair of gate electrodes 46a and 46b. Within FIG. 6, the conformal second dielectric layer 52 is preferably formed of a dielectric material of analogous or equivalent dielectric characteristics to the planarized pre-metal dielectric (PMD) layer 50.

Figure 7:
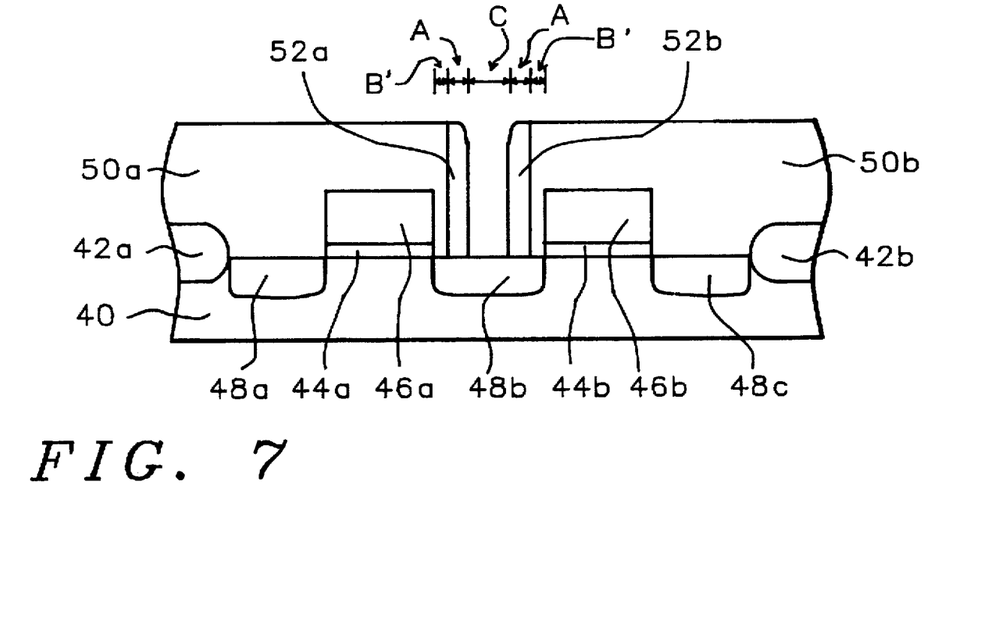

Referring now to FIG. 7, there is shown a schematic cross-sectional diagram illustrating the results of further processing of the integrated circuit whose schematic cross-sectional diagram is illustrated in FIG. 6. Shown in FIG. 7 is the results of anisotropically etching the conformal second dielectric layer 52 as is illustrated in FIG. 6 to form the second dielectric spacer layers 52a and 52b. Similarly with forming the second integrated circuit spacer layers 36a and 36b within the integrated circuit whose schematic cross-sectional diagram is illustrated in FIG. 4 from the conformal second integrated circuit layer 36 whose schematic cross-sectional diagram is illustrated in FIG. 3, the anisotropic etching method employed in forming the second dielectric spacer layers 52a and 52b as illustrated in FIG. 7 from conformal second dielectric layer 52 as illustrated in FIG. 6 removes completely the central portion of the conformal second dielectric layer 52 at the bottom of the wide via while simultaneously not substantially etching the portions of the conformal second dielectric layer 52 formed upon the sidewalls of the wide via.

Upon completion of anisotropic etching of the conformal second dielectric layer 52 to form the second dielectric spacer layers 52a and 52b, there is formed through the second preferred embodiment of the method of the present invention a narrow via of width C through a planarized pre-metal dielectric (PMD) layer 50, thus accessing the source/drain region 48b shared by the adjoining pair of field effect transistors (FETs) formed beneath the planarized pre-metal dielectric (PMD) layer 50. The narrow via of width C so formed is formed with improved registration and improved resolution since the photoexposure apparatus employed in ultimately forming the narrow via of width C first forms the wide via of width C+2A, which wide via is then subsequently subjected to further non-photolithographic processing in forming the narrow via. Under such circumstances, the narrow via of width C may be formed of a width not otherwise resolvable by the photoexposure apparatus employed in forming the wide via of width C+2A, thus simultaneously allowing a narrow separation width of the pair of gate electrodes 46a and 46b not otherwise achievable within the pair of field effect transistors (FETS) within which is formed the pair of gate electrodes 46a and 46b.

As is similarly understood by a person skilled in the art, the via size reduction aspects of the second preferred embodiment of the method of the present invention may also be employed in general when it is desired to form through an integrated circuit layer within an integrated circuit a narrow via of width not otherwise resolvable by an available photoexposure apparatus. The narrow via, or the wide via from which is formed the narrow via, need not necessarily be bounded by integrated circuit structures such as the gate electrodes 46a and 46b as illustrated within FIG. 5 to FIG. 7.

As is understood by a person skilled in the art, the preferred embodiments of the method of the present invention are illustrative of the method of the present invention rather than limiting of the method of the present invention. Revisions and modifications may be made to materials, structures and dimensions through which is practiced the preferred embodiments of the method of the present invention while still providing embodiments which are within the spirit and scope of the present invention, as defined by the accompanying claims.

What is claimed is:

1. A method for forming a via through an integrated circuit layer comprising:

providing a substrate layer having a pair of conductor structures formed thereupon;

forming upon the substrate layer and the pair of conductor structures a first integrated circuit layer;

forming through the first integrated circuit layer at a location between the pair of conductor structures a wide via, the wide via being formed through a photolithographic method employing a photoexposure apparatus;

forming conformally into the wide via a conformal second integrated circuit layer to leave remaining within the first integrated circuit layer an aperture of width equal to the width of the wide via minus two times a minimum isolation requirement separating the wide via from each conductor structure within the pair of conductor structures; and anisotropically etching the conformal second integrated circuit layer to remove completely a central portion of the conformal second integrated circuit layer from the bottom of the wide via while not substantially etching the portions of the conformal second integrated circuit layer formed upon the sidewalls of the wide via, thus forming a narrow via coaxial through the integrated circuit layer at the location of the wide via.

2. The method of claim 1 wherein the narrow via has a width not resolvable by the photoexposure apparatus.

3. The method of claim 1 wherein the substrate layer is chosen from the group of substrate layers consisting of conductor substrate layers, semiconductor substrate layers and insulator substrate layers.

4. The method of claim 1 wherein the first integrated circuit layer and the second integrated circuit layer are formed from a material chosen from the group of materials consisting of conductor materials, semiconductor materials and insulator materials.

5. A method for forming a via through an integrated circuit layer formed between a pair of horizontally spaced integrated circuit structures formed within an integrated circuit comprising:

forming over a substrate layer a pair of integrated circuit structures, the pair of integrated circuit structures being separated by a separation width over the substrate layer, the separation width being no less than the width of a narrow via desired to be formed through a portion of a first integrated circuit layer formed between the pair of integrated circuit structures plus two times a registration tolerance of a photoexposure apparatus employed in defining the location of a wide via from which is formed the narrow via plus two times a minimum integrated circuit layer width separating the narrow via from each integrated circuit structure within the pair of integrated circuit structures;

forming upon the substrate layer and between the integrated circuit structures the first integrated circuit layer;

forming through the portion of the first integrated circuit layer formed between the pair of integrated circuit structures the wide via, the wide via having a width equal to the width of the narrow via plus two times the minimum integrated circuit layer width separating the narrow via from each integrated circuit structure within the pair of integrated circuit structures;

forming conformally into the wide via a conformal second integrated circuit layer of thickness substantially equal to a minimum isolation distance requirement separating the narrow via from each integrated circuit structure within the pair of integrated circuit structures under an extreme misalignment of the photoexposure apparatus; and anisotropically etching the conformal second integrated circuit layer to remove completely a central portion of the conformal second integrated circuit layer from the bottom of the wide via while not substantially etching the portions of the conformal second integrated circuit layer formed upon the sidewalls of the wide via, thus forming a narrow via coaxial through the first integrated circuit layer at the location of the wide via.

6. The method of claim 5 wherein the narrow via has a width not resolvable by the photoexposure apparatus.

7. The method of claim 5 wherein the substrate layer is chosen from the group of substrate layers consisting of conductor substrate layers, semiconductor substrate layers and insulator substrate layers.

8. The method of claim 5 wherein the integrated circuit structures are chosen from the group of integrated circuit structures consisting of integrated circuit conductor structures, integrated circuit semiconductor structures and integrated circuit insulator structures.

9. The method of claim 5 wherein the first integrated circuit layer and the second integrated circuit layer are formed from a material chosen from the group of materials consisting of conductor materials, semiconductor materials and insulator materials.

10. The method of claim 5 wherein:

the width of the narrow via is from about 0.05 to about 0.5 microns;

the registration tolerance of the photoexposure apparatus is from about 0.02 to about 0.2 microns; and the minimum integrated circuit layer width separating the narrow via from each integrated circuit structure within the pair of integrated circuit structures is from about 0.025 to about 0.25 microns.

11. A method for forming a via through an integrated circuit dielectric formed between a pair of horizontally spaced integrated circuit structures formed within an integrated circuit comprising:

forming over a substrate layer a pair of integrated circuit structures, the pair of integrated circuit structures being separated by a separation width over the substrate layer, the separation width being no less than the width of a narrow via desired to be formed through a portion of a first integrated circuit dielectric layer formed between the pair of integrated circuit structures plus two times a registration tolerance of a photoexposure apparatus employed in defining the location of a wide via from which is formed the narrow via plus two times a minimum integrated circuit layer width separating the narrow via from each integrated circuit structure within the pair of integrated circuit structures;

forming upon the substrate layer and between the integrated circuit structures the first integrated circuit dielectric layer;

forming through the portion of the first integrated circuit dielectric layer formed between the pair of integrated circuit structures the wide via, the wide via having a width equal to the width of the narrow via plus two times the minimum integrated circuit layer width separating the narrow via from each integrated circuit structure within the pair of integrated circuit structures;

forming conformally into the wide via a conformal second integrated circuit dielectric layer of thickness substantially equal to the minimum integrated circuit layer width separating the narrow via from each integrated circuit structure within the pair of integrated circuit structures; and anisotropically etching the conformal second integrated circuit dielectric layer to remove completely a central portion of the conformal second integrated circuit dielectric layer from the bottom of the wide via while not substantially etching the portions of the conformal second integrated circuit dielectric layer formed upon the sidewalls of the wide via, thus forming a narrow via coaxial through the first integrated circuit dielectric layer at the location of the wide via.

12. The method of claim 11 wherein the narrow via has a width not resolvable by the photoexposure apparatus.

13. The method of claim 11 wherein the substrate layer is chosen from the group of substrate layers consisting of conductor substrate layers, semiconductor substrate layers and insulator substrate layers.

14. The method of claim 11 wherein the integrated circuit structures are chosen from the group of integrated circuit structures consisting of integrated circuit conductor structures and integrated circuit semiconductor structures.

15. The method of claim 11 wherein:

the width of the narrow via is from about 0.05 to about 0.5 microns;

the registration tolerance of the photoexposure apparatus is from about 0.02 to about 0.2 microns; and the minimum integrated circuit layer width separating the narrow via from each integrated circuit structure within the pair of integrated circuit structures is from about 0.025 to about 0.25 microns.

16. A method for forming a via through a dielectric layer formed between a pair of gate electrodes within an adjoining pair of field effect transistors (FETs) comprising:

forming within and upon a semiconductor substrate an adjoining pair of field effect transistors (FETs) which share a source/drain region formed within the semiconductor substrate, the pair of field effect transistors (FETs) having a pair of gate electrodes separated by a separation width over the semiconductor substrate, the separation width over the semiconductor substrate being no less than the width of a narrow via desired to be formed through a portion of a first dielectric layer formed between the pair of gate electrodes plus two times a registration tolerance of a photoexposure apparatus employed in defining the location of a wide via from which is formed the narrow via plus two times a minimum integrated circuit layer width separating the narrow via from each gate electrode within the pair of gate electrodes;

forming upon the semiconductor substrate including the pair of field effect transistors (FETs) the first dielectric layer;

forming through the portion of the first dielectric layer separated by the pair of gate electrodes the wide via, the wide via having a width equal to the width of the narrow via plus two times the minimum integrated circuit layer width separating the narrow via from each gate electrode within the pair of gate electrodes;

forming conformally into the wide via a conformal second dielectric layer of thickness substantially equal to the minimum integrated circuit layer width separating the narrow via from each gate electrode within the pair of gate electrodes; and anisotropically etching the conformal second dielectric layer to remove completely a central portion of the conformal second dielectric layer from the bottom of the wide via while not substantially etching the portions of the conformal second dielectric layer formed upon the sidewalls of the wide via, thus forming a narrow via coaxial through the first dielectric layer at the location of the wide via.

17. The method of claim 16 wherein the narrow via has a width not resolvable by the photoexposure apparatus.

18. The method of claim 16 wherein:

the width of the narrow via is from about 0.05 to about 0.5 microns;

the registration tolerance of the photoexposure apparatus is from about 0.02 to about 0.2 microns; and the minimum integrated circuit layer width separating the narrow via from each gate electrode within the pair of gate electrodes is from about 0.025 to about 0.25 microns.

* * * * *